(12) United States Patent
Nagata

(10) Patent No.: US 8,389,071 B2
(45) Date of Patent: Mar. 5, 2013

(54) APPARATUS AND METHOD FOR FORMING CARBON PROTECTIVE LAYER

(75) Inventor: Naruhisa Nagata, Matsumoto (JP)

(73) Assignee: Fuji Electric Co., Ltd. (JP)

( * ) Notice: Subject to any disclaimer, the term of this patent is extended or adjusted under 35 U.S.C. 154(b) by 0 days.

(21) Appl. No.: 13/149,352

(22) Filed: May 31, 2011

(65) Prior Publication Data
US 2011/0229657 A1 Sep. 22, 2011

Related U.S. Application Data

(62) Division of application No. 12/205,885, filed on Sep. 7, 2008, now abandoned.

(30) Foreign Application Priority Data

Sep. 19, 2007 (JP) .................. 2007-242541

(51) Int. Cl.
*H05H 1/24* (2006.01)
*C23C 16/00* (2006.01)
*C23C 16/26* (2006.01)

(52) U.S. Cl. .................. 427/569; 427/249.1

(58) Field of Classification Search .............. 427/569, 427/131, 249.1
See application file for complete search history.

(56) References Cited

U.S. PATENT DOCUMENTS

| 5,578,130 A | 11/1996 | Hayashi et al. |
| 5,645,698 A | 7/1997 | Okano |
| 6,399,151 B2* | 6/2002 | Lee et al. .................. 427/249.8 |
| 2003/0101935 A1* | 6/2003 | Walther .................. 118/723 E |
| 2004/0094403 A1* | 5/2004 | Economikos et al. ........ 204/212 |

FOREIGN PATENT DOCUMENTS

| JP | 2001-148118 A | 5/2001 |
| JP | 2003-030823 A | 1/2003 |

* cited by examiner

*Primary Examiner* — Timothy Meeks
*Assistant Examiner* — Mandy Louie
(74) *Attorney, Agent, or Firm* — Rossi, Kimms & McDowell LLP

(57) ABSTRACT

An apparatus and method for forming a carbon protective layer on a substrate using a plasma CVD method allows a more uniform in-plane distribution of the carbon protective layer thickness. The apparatus includes an annular anode that generates a plasma beam and a disk-shaped shield disposed between the anode and the substrate. The anode, the shield, and the substrate are concentrically arranged so that a straight line connecting the centers of the anode and the substrate is perpendicular to the deposition surface of the substrate where the carbon protective layer is to be formed. The center of the shield is also on the straight line.

5 Claims, 4 Drawing Sheets

Position of Anode

Position of Substrate for Film Formation

APPARATUS AND METHOD FOR FORMING CARBON PROTECTIVE LAYER

This is a division of application Ser. No. 12/205,885 filed 7 Sep. 2008, the entire disclosure of which is herein incorporated by reference.

BACKGROUND

Examples of carbon protective layers used for coating sliding-resistant members or friction-resistant members include diamond-like carbon (DLC) films and graphite carbon films. Carbon protective layers are formed on magnetic recording layers of magnetic recording media to serve as sliding-resistant members to protect the magnetic recording layers from damage or corrosion induced by sliding and contact with magnetic heads. In recent years, DLC films formed by a plasma CVD method have been used. This is because a DLC film formed by the plasma CVD method is denser and harder than a film formed by a sputtering method. This feature is apparently due to the fact that the DLC film formed by the plasma CVD method is formed by hydrocarbon radicals, and a tetrahedral structure with a high three-dimensional rigidity is easily formed via hydrogen.

The increase in recording density is a requirement applied to magnetic recording media, and reducing the thickness of protective film and decreasing the distance between a head element and a magnetic recording layer is an effective means for meeting this requirement. When the film thickness is reduced, it is important to have a uniform in-plane distribution of the film thickness. Thus, even where the in-plane average value of film thickness is sufficient to obtain the predetermined electromagnetic conversion characteristic and the thickness is sufficient to ensure reliability, such as corrosion resistance, where the in-plane distribution of film thickness is nonuniform, the predetermined electromagnetic conversion characteristic cannot be obtained in thick places, whereas the reliability such as corrosion resistance cannot be ensured in thin places.

A method of disposing an appropriate shield within a plasma CVD chamber when a DLC film is formed by a plasma CVD method with the object of obtaining a uniform in-plane distribution of protective film thickness has been investigated. See for example Japanese Patent Applications Laid-open Nos. 2001-148118 and 2003-30823. With the usual plasma CVD method, the film thickness in the central zone of a substrate for film formation tends to increase because plasma irradiating the substrate is concentrated in the central zone. Disposing a shield in the vicinity of the central zone can make the film thickness more uniform. See, for example, paragraph 0010 of Japanese Patent Application Laid-open No. 2003-30823.

Further improvements, however, are needed to obtain a more uniform film thickness. Accordingly, there still remains a need for forming a carbon protective layer using a plasma CVD method, which makes it possible to bring the in-plane distribution of film thickness close to a uniform distribution.

SUMMARY OF THE INVENTION

The present invention relates to an apparatus and a method for forming a carbon protective layer on a substrate, such as for a magnetic recording medium, by a plasma CVD method.

One aspect of the present invention is an apparatus for forming a carbon protective layer on a substrate by a plasma CVD method. The apparatus includes an annular-shaped plasma beam generation source and a disk-shaped shield. The annular-shaped plasma beam generation source is configured to be spaced from and disposed parallel to a deposition surface of the substrate, where the carbon protective layer is to be formed. The disk-shaped shield is spaced from the annular-shaped plasma beam generation source and configured to be positioned between the annular-shaped plasma beam generation source and the substrate. The disk-shaped shield is concentrically arranged with the annular-shaped plasma beam generation source and the deposition surface of the substrate so that a straight line connecting a center of the annular plasma beam generation source and a center of the deposition surface of the substrate is perpendicular to the deposition surface of the substrate.

The disk-shaped shield has a radius equal to an overlap radius A, and a distance x between the disk-shaped shield and the annular-shaped plasma beam generation source satisfies the equation $x=[\{R/(R+A)\}+B] \cdot L$, where R is a radius of the plasma beam generation source, L is a distance between the annular-shaped plasma beam generation source and the deposition surface of the substrate, and B is a range of −0.1 or more to 0.1 or less.

Another aspect of the present invention is a method of forming a carbon protective layer on a substrate by a plasma CVD method. The method includes disposing the deposition surface of the substrate, where the carbon protective layer is to be formed, parallel to and spaced from the annular-shaped plasma beam generation source, and disposing the disk-shaped shield spaced from the annular-shaped plasma beam generation source between the annular-shaped plasma beam generation source and the substrate. The disk-shaped shield is concentrically arranged with the annular-shaped plasma beam generation source and the deposition surface of the substrate so that a straight line connecting a center of the annular plasma beam generation source and a center of the deposition surface of the substrate is perpendicular to the deposition surface of the substrate.

Another aspect of the present invention is a magnetic recording medium having a carbon protective layer formed by the apparatus or the method.

DETAILED DESCRIPTION

Figure 1:
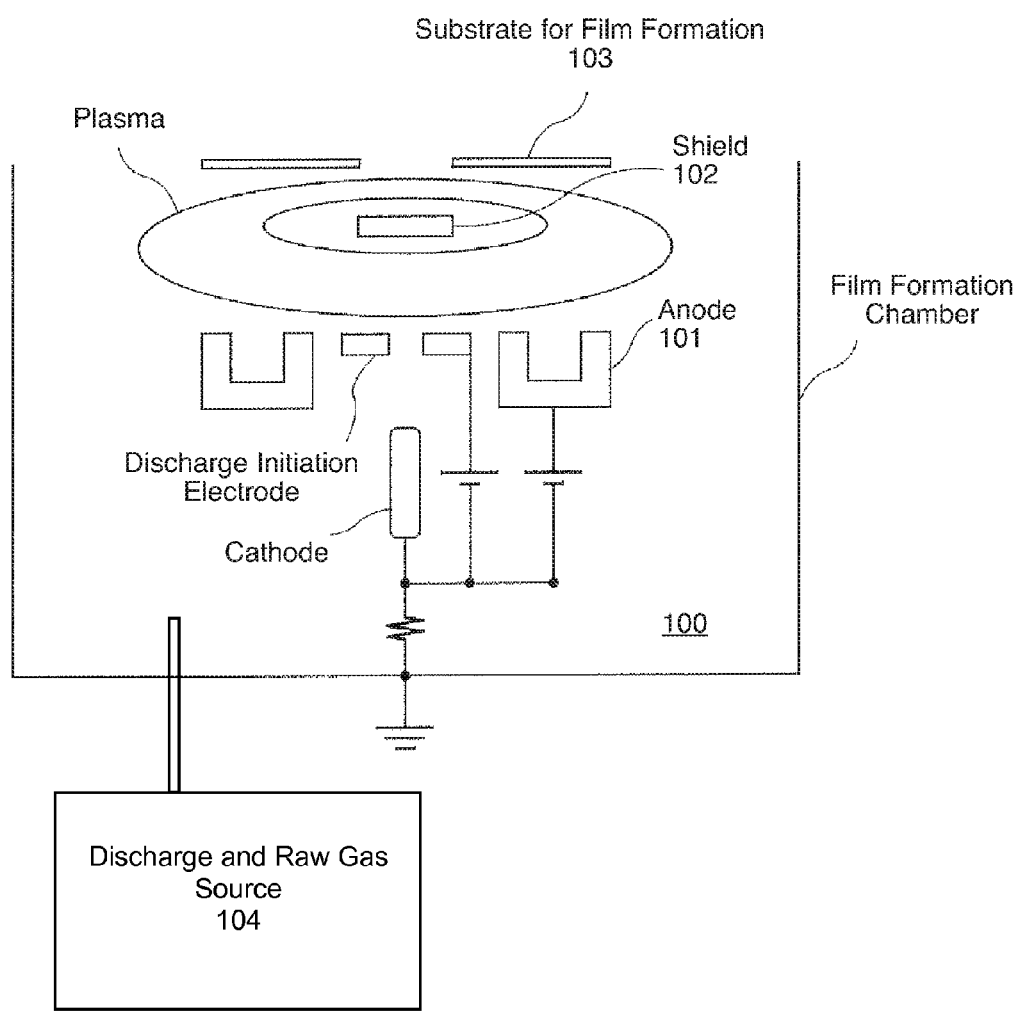
FIG. 1 schematically illustrates a sectional view of an apparatus for forming a carbon protective layer according to the present invention.

Referring to FIG. 1, an apparatus 100 for forming a carbon protective layer using a plasma CVD method, which uses a raw-gas containing carbon, such as acetylene, has an annular anode 101 that generates a plasma beam and a disk-shaped shield 102 disposed between the annular anode 101 and a substrate 103 for forming a film. The annular anode 101 and a deposition surface or region of the substrate, where the carbon protective film is to be formed, are parallel to each other and concentrically arranged so that a straight line connecting the centers of the anode and the deposition surface is perpendicular to the deposition surface. The center of the disk-shaped shield 102 is on the straight line and also concentrically arranged with the anode 101 and the substrate 103.

The raw-gas containing carbon is supplied from a discharge-gas and raw-gas supply or source 104.

Benefits can be achieved in the apparatus 100 that features a combination of the annular anode 101 and the disk-shaped shield 102. By providing the disk-shaped shield 102, the concentration of plasma in the central zone of the substrate can be avoided and the in-plane distribution of film thickness can be made more uniform. By using the annular-shaped anode serving as a plasma beam generation source, the plasma density in the central zone can be decreased so that even more uniform in-plane distribution can be realized.

Further, by forming a magnetic recording medium comprising the substrate, which can be the base material thereof, and a magnetic recording layer disposed on the base material, it is possible to form a carbon protective layer on a magnetic recording layer with the apparatus 100. The present invention is intended to cover the magnetic recording medium.

Figure 2:
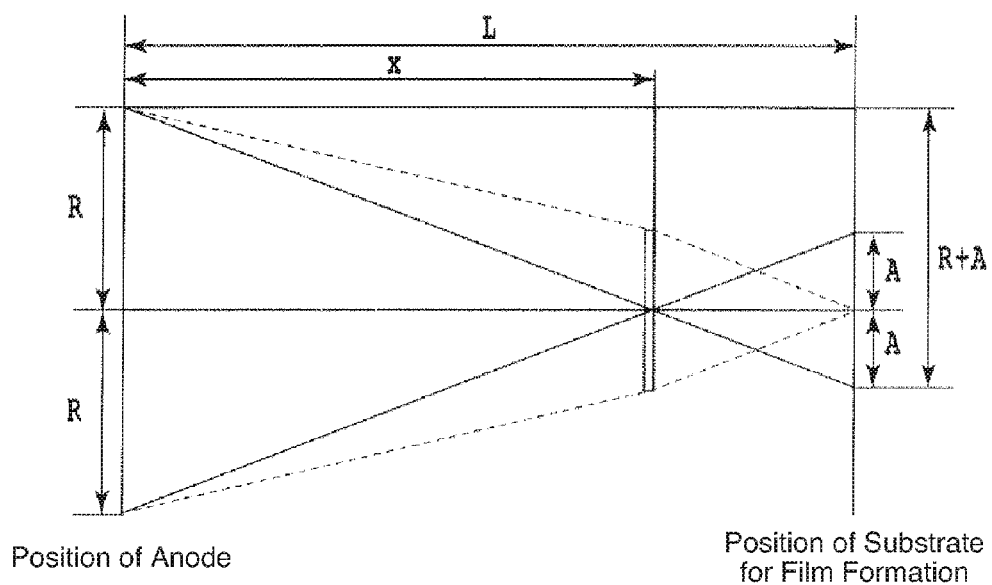
FIG. 2 explains the position and size of a disk-shaped shield of the apparatus of FIG. 1.

FIG. 2 explains the position and size of the disk-shaped shield. The distance between the annular anode 101 and the deposition location of the substrate 103 is denoted by L, the distance between the annular anode 101 and the disk-shaped shield 102 is denoted by x, and the radius of the annular anode 101 is denoted by R. According to the results obtained in the below-described examples, the uniformity of in-plane distribution of film thickness can be improved when the distance x is obtained from the following Equation: $x=[\{R/(R+A)\}+B] \cdot L$, while making the radius of the disk-shaped shield 102 equal to A, which represents a radius at the position on the substrate that is overlapped with the plasma beam (referred to hereinbelow as "overlap radius") when no disk-shaped shield is provided, and B being a range (tolerance) of −0.1 or more to 0.1 or less.

Figure 3:
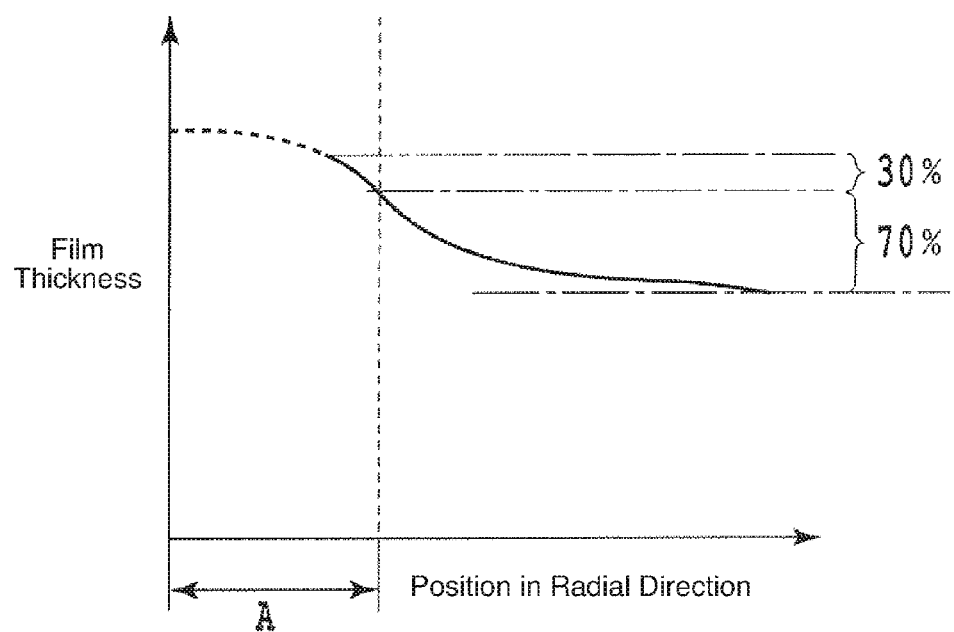
FIG. 3 explains the overlap radius A.

The overlap radius is calculated in the following manner. First, a carbon protective layer is formed without providing a disk-shaped shield, and a thickness of the carbon protective layer on the substrate for film formation is measured. The film thickness distribution in the radial direction is plotted, as shown in FIG. 3, the difference in film thickness between the radial position of the outer circumferential portion of the central hole (referred to hereinbelow as the "innermost circumference"; for example, with a radius of 12.5 mm) and the radial position of the outer radial portion of the substrate (referred to hereinbelow as the "outermost circumference") is taken as 100%, and the radial position in which the film thickness has changed by 30% with respect to that at the innermost circumference is taken as A. The broken-line portion of the film thickness distribution indicates a portion of the central hole. On the inside of the overlap radius A, the plasma beam overlaps as shown in FIG. 2, and the film thickness increases. Therefore, the film thickness reaches a maximum on the innermost circumference and a minimum on the outermost circumference, and usually the radial position in which the film thickness decreases by 30% with respect to that at the innermost circumference is taken as A.

Figure 4:
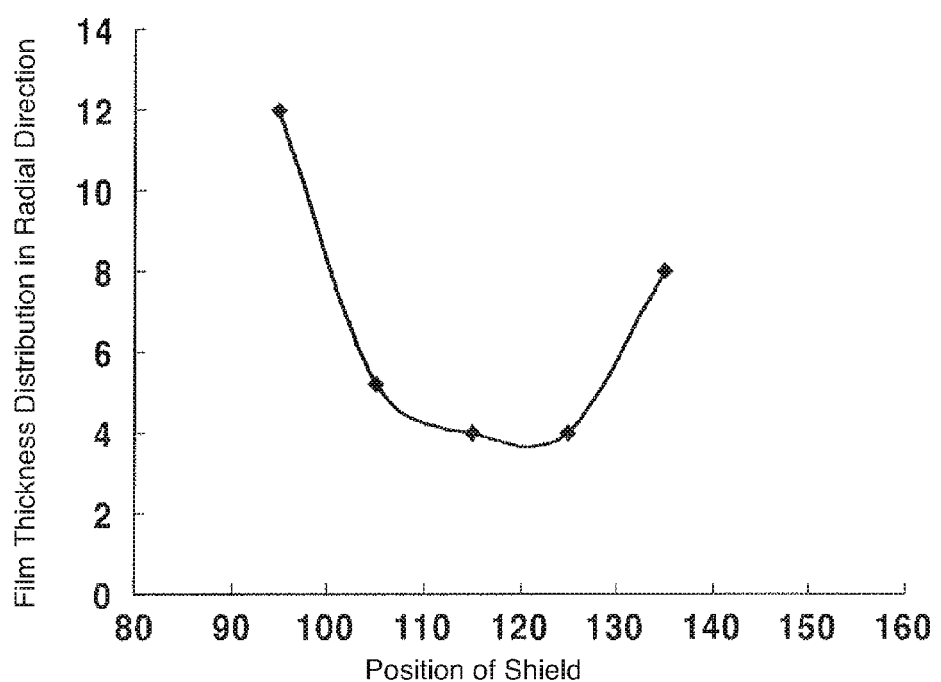
FIG. 4 illustrates the results obtained in Examples 1 to 3 and Comparative Examples 1 and 2.

With the apparatus 100 having the above configuration, the in-plane distribution of film thickness can be made more uniform, without decreasing the film formation rate. Examples will be described below. The results obtained in Examples 1 to 3 and Comparative Examples 1 and 2 are shown in FIG. 4.

In Example 1, in a hollow-cathode plasma CVD apparatus, the distance L between the anode 101 and the deposition location (i.e., surface) of the substrate 103 was set at 160 mm, the distance x between the anode 101 and the 102 shield was set at 115 mm, and the radius R of the anode 101 was set at 45 mm. The shield was made of stainless steel and had a thickness of 2 mm, and the electric potential thereof was a ground potential. The substrate 103 was made of aluminum and had a diameter of 95 mm and a thickness of 1.27 mm.

When a DLC film was formed on a magnetic recording medium to obtain a magnetic recording layer using the substrate 103, because the overlap radius A was 17.5 mm, the shield radius was set at 17.5 mm. Here, argon (30 sccm) was used as a discharge gas, and acetylene (30 sccm) was used as a raw material gas. Calculating the distance x using the Equation, the following value is obtained: $x=(0.720\pm0.1) \cdot 160 (mm)=115\pm16 (mm)$. In the Example 1, x was set at 115 mm, thus satisfying the equation.

Under the above conditions, the film formation time was adjusted and a DLC film with a thickness of 2.5 nm in the intermediate circumferential portion was obtained. The "inner circumferential portion" means a region on the inner circumferential side in a data recording portion of a disk-shaped magnetic recording medium and generally indicates a region with a radius of about 20 mm in the case of a rated 3.5 inch substrate (substrate with a diameter of 95 mm). The "outer circumferential portion" means a region on the outer circumferential side in a data recording portion of a disk-shaped magnetic recording medium and generally indicates a region with a radius of about 40 mm in the case of a rated 3.5 inch substrate. The "intermediate circumferential portion" indicates a region between the "inner circumferential portion" and the "outer circumferential portion" and generally indicates a region with a radius of about 30 mm in the case of a rated 3.5 inch substrate.

The in-plane distribution of film thickness was measured with an optical surface inspection device. The film thickness was 2.5 nm in the intermediate circumferential portion, 2.5 nm in the inner circumferential portion, and 2.4 nm in the outer circumferential portion, and the radial distribution of film thickness (the ratio of the difference between the maximum value and minimum value divided by the value in the intermediate circumferential portion) was less than 6%, which is good.

In Example 2, a DLC film was formed under the same conditions as in Example 1, except that the distance x between the anode and the shield was set at 105 mm. The set distance x is still within the range of $x=115\pm16$ (mm), thus satisfying the Equation. The in-plane distribution of film thickness was measured with an optical surface inspection device. The film thickness was 2.5 nm in the intermediate circumferential portion, 2.53 nm in the inner circumferential portion, and 2.4 nm in the outer circumferential portion, and the radial distribution of film thickness was still less than 6%.

In Example 3, a DLC film was formed under the same conditions as in Example 1, except that the distance x between the anode and the shield was set at 125 mm. The set distance x is still within the range of $x=115\pm16$ (mm), thus satisfying the Equation. The in-plane distribution of film thickness was measured with an optical surface inspection device. The film thickness was 2.5 nm in the intermediate circumferential portion, 2.48 nm in the inner circumferential portion, and 2.4 nm in the outer circumferential portion, and the radial distribution of film thickness was still less than 6%.

In Comparative Example 1, a DLC film was formed under the same conditions as in Example 1, except that the distance x between the anode and the shield was set at 95 mm. The set distance x was outside the range of $x=115\pm16$ (mm), thus not satisfying the Equation. The in-plane distribution of film thickness was measured with an optical surface inspection device. The film thickness was 2.5 nm in the intermediate circumferential portion, 2.7 nm in the inner circumferential portion, and 2.4 nm in the outer circumferential portion, and the radial distribution of film thickness was more than 6%, which is worse than in Examples 1 to 3. This is apparently because the disk-shaped shield was too far from the substrate 103, and shielding of the plasma beam that tended to concentrate in the central zone of the substrate became insufficient.

In Comparative Example 2, a DLC film was formed under the same conditions as in Example 1, except that the distance x between the anode and the shield was set at 135 mm. The set distance x was outside the range of x=115±16 (mm), thus not satisfying the Equation. The in-plane distribution of film thickness was measured with an optical surface inspection device. The film thickness was 2.5 nm in the intermediate circumferential portion, 2.3 nm in the inner circumferential portion, and 2.4 nm in the outer circumferential portion, and the radial distribution of film thickness was more than 6%, which is worse than in Examples 1 to 3. This is apparently because the disk-shaped shield was too close to the substrate 103, and shielding of the plasma beam that tended to concentrate in the central zone of the substrate became excessive.

In Comparative Example 3, a DLC film was formed under the same conditions as in Example 1, except that the radius of the disk-shaped shield was set at 7.5 mm. The distance x calculated using the Equation was x=(0.857±0.1)·160 (mm) =137±16 (mm). Since the distance x was set at 115 mm, the Equation was not satisfied. The in-plane distribution of film thickness was measured with an optical surface inspection device. The film thickness was 2.5 nm in the intermediate circumferential portion, 2.7 nm in the inner circumferential portion, and 2.4 nm in the outer circumferential portion, and the radial distribution of film thickness was more than 6%, which is worse than in Examples 1 to 3. This is apparently because the disk-shaped shield was too small, and shielding of the plasma beam that tended to concentrate in the central zone of the substrate became insufficient.

In Comparative Example 4, a DLC film was formed under the same conditions as in Example 1, except that the radius of the disk-shaped shield was set at 27.5 mm. The distance x calculated using the Equation 1 was x=(0.621±0.1)·160 (mm) =99.3±16 (mm). Since the distance x was set at 115 mm, the Equation was satisfied. The in-plane distribution of film thickness was measured with an optical surface inspection device. The film thickness was 2.5 nm in the intermediate circumferential portion, 2.48 nm in the inner circumferential portion, and 2.4 nm in the outer circumferential portion, and the radial distribution of film thickness was less than 6%, which is good. But the film formation time necessary to form a film with a thickness of 2.5 nm was 1.9 times greater that in Example 1, thus decreasing productivity. This is apparently because, when the disk-shaped shield is too large, although the uniformity of the film thickness distribution in the radial direction is improved, the shielding effect decreased the overall deposition rate.

While the present invention has been particularly shown and described with reference to preferred embodiments, it will be understood by those skilled in the art that the foregoing and other changes in form and details can be made therein without departing from the spirit and scope of the present invention. All modifications and equivalents attainable by one versed in the art from the present disclosure within the scope and spirit of the present invention are to be included as further embodiments of the present invention. The scope of the present invention accordingly is to be defined as set forth in the appended claims.

This application is based on and claims priority to Japanese Patent Application 2007-242541 filed on 19 Sep. 2007. The disclosure of the priority application in its entirety, including the drawings, claims, and the specification thereof, is incorporated herein by reference.

What is claimed is:

1. A method of forming a carbon protective layer on a disk-shaped substrate by a plasma CVD method, the method comprising the steps of:
   disposing the disk-shaped substrate so that a deposition surface of the disk-shaped substrate, where the carbon protective layer is to be formed, is parallel to and spaced from an annular-shaped plasma beam generation source; and
   disposing a disk-shaped shield spaced from the annular plasma beam generation source between the annular-shaped plasma beam generation source and the disk-shaped substrate,
   wherein the disk-shaped shield is concentrically arranged with the annular-shaped plasma beam generation source and the deposition surface of the disk-shaped substrate so that a straight line connecting a center of the annular-shaped plasma beam generation source and a center of the deposition surface of the disk-shaped substrate is perpendicular to the deposition surface of the disk-shaped substrate, and,
   wherein the annular-shaped plasma beam generation source is composed of an annular-shaped anode having an outer diameter that is substantially the same as an outer diameter of the disk-shaped substrate, and
   wherein a relative position between the annular-shaped plasma beam generation source and the disk-shaped substrate is fixed.

2. The method according to claim 1, further comprising the step of supplying only discharge gas and raw material gas for forming the carbon protective layer via the plasma CVD method.

3. The method according to claim 1, wherein the disk-shaped substrate has a center hole for forming a disk-shaped magnetic recording medium.

4. The method according to claim 3, wherein:
   the disk-shaped shield has a radius A, and
   the radius A is selected at a point where a film thickness formed on the disk-shaped substrate without the shield is changed by 30% from a maximum film thickness formed on the disk-shaped substrate without the shield, which maximum film thickness is at the periphery of the center hole.

5. The method according to claim 1, wherein:
   the plasma CVD method uses carbon containing gas as a raw material for forming the carbon protective layer, and
   the method further comprises supplying the carbon containing gas for forming the carbon protective layer.

* * * * *